(12) United States Patent
Yoshida et al.

(10) Patent No.: US 9,944,848 B2
(45) Date of Patent: Apr. 17, 2018

(54) FLUORIDE FLUORESCENT MATERIAL, METHOD FOR PRODUCING THE SAME, AND LIGHT EMITTING DEVICE

(71) Applicant: NICHIA CORPORATION, Anan-shi, Tokushima (JP)

(72) Inventors: Tomokazu Yoshida, Anan (JP); Shoji Hosokawa, Tokushima (JP); Sadakazu Wakui, Tokushima (JP); Toshiyuki Okazaki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 39 days.

(21) Appl. No.: 14/867,614

(22) Filed: Sep. 28, 2015

(65) Prior Publication Data
US 2016/0090528 A1   Mar. 31, 2016

(30) Foreign Application Priority Data

Sep. 30, 2014 (JP) ................................. 2014-202266
May 19, 2015 (JP) ................................. 2015-101820

(51) Int. Cl.
*C09K 11/61* (2006.01)
*H01L 33/50* (2010.01)

(52) U.S. Cl.
CPC .......... *C09K 11/617* (2013.01); *H01L 33/504* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01)

(58) Field of Classification Search
CPC ............................ C09K 11/576; C09K 11/617
See application file for complete search history.

(56) References Cited

U.S. PATENT DOCUMENTS

| | | | |
|---|---|---|---|
| 2012/0256125 A1† | 10/2012 | Kaneyoshi | |
| 2014/0268655 A1 | 9/2014 | Murphy et al. | |
| 2015/0048399 A1 | 2/2015 | Weiler et al. | |
| 2015/0315461 A1 | 11/2015 | Lyons et al. | |
| 2015/0361336 A1* | 12/2015 | Garcia | H05B 33/12 313/503 |
| 2016/0024378 A1* | 1/2016 | Murphy | C09K 11/617 362/84 |
| 2016/0340577 A1 | 11/2016 | Hiramatsu et al. | |

FOREIGN PATENT DOCUMENTS

| | | |
|---|---|---|
| JP | 2010-209311 A | 9/2010 |
| JP | 2012-224536 A | 11/2012 |
| JP | 2013-012711 A | 1/2013 |
| JP | 2014-514388 A | 6/2014 |
| JP | 2014-177511 A | 9/2014 |
| JP | 2015113362 A | 6/2015 |
| JP | 2015-163675 A | 9/2015 |
| JP | 2015-212375 A | 11/2015 |
| WO | 2009-110285 A1 | 9/2009 |
| WO | 2012-128837 A1 | 9/2012 |
| WO | 2013/121355 A1 | 8/2013 |
| WO | 2014/152787 A1 | 9/2014 |
| WO | WO2015087861 † | 6/2015 |
| WO | WO2015115195 † | 8/2015 |
| WO | 2015/129743 A1 | 9/2015 |
| WO | WO2015129743 † | 9/2015 |
| WO | 2015-191793 A2 | 12/2015 |

OTHER PUBLICATIONS

Office Action dated Dec. 8, 2015, in Japanese Application No. 2014-202266, with English-language translation.
Office Action dated Dec. 8, 2015, in Japanese Application No. 2015-101820, with English-language translation.
Commission of the Ministry of Economy, Trade and Industry: 2012 International Standard Development Project, Report on Results of Efforts to Standardize Methods for Evaluating Optical Properties of Phosphors Using for White LED (Mar. 2013, Japan Fine Ceramics Association) (with relevant portions translated into English). (JP Written Opp. Dec. 26, 2016).
Commission of the Ministry of Economy, Trade and Industry: 2012 International Standard Development Project, Report on Results of Efforts to Standardize Methods for Evaluating Optical Properties of White LEDs (Mar. 2013, Japan Fine Ceramics Association); pp. 4, 8, 39, 47, and 53-54.†

\* cited by examiner
† cited by third party

*Primary Examiner* — Matthew E Hoban
(74) *Attorney, Agent, or Firm* — Andrews Kurth Kenyon LLP

(57) ABSTRACT

A method for producing a fluoride fluorescent material including: preparing a first solution containing manganese, a second solution containing at least one cation selected from the group consisting of $K^+$, $Li^+$, $Na^+$, $Rb^+$, $Cs^+$, and $NH_4^+$, and a third solution containing at least one element selected from the group consisting of the elements from Groups 4 and 14 of the periodic table, and adding the first and third solutions dropwise, each at a rate of 0.3% or less of the total volume of the solution per minute to the second solution to obtain particles having a composition represented by formula (I): $A_2[M_{1-a}Mn^{4+}{}_aF_6]$ (I) wherein A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies $0.04<a<0.20$.

5 Claims, 4 Drawing Sheets

FLUORIDE FLUORESCENT MATERIAL, METHOD FOR PRODUCING THE SAME, AND LIGHT EMITTING DEVICE

CROSS-REFERENCE TO RELATED APPLICATIONS

This application claims priority under 35 USC 119 from Japanese patent Application No. 2014-202266, filed on Sep. 30, 2014 and Japanese patent Application No. 2015-101820, filed on May 19, 2015, the entire disclosures of which are incorporated by reference herein.

BACKGROUND OF THE INVENTION

Field of the Invention

This disclosure relates to a fluoride fluorescent material, a method for producing the same, and a light emitting device.

Description of the Related Art

A light emitting diode (LED) is a semiconductor light-emitting element produced from a metal compound, such as gallium nitride (GaN). Various types of light emitting devices that emit light of, e.g., white color, bulb color, or orange color have been developed using such a semiconductor light-emitting element in combination with a fluorescent material. Such light emitting devices are able to emit, e.g., white light by the light color mixture principle. Well known systems that emit white light include systems using a light emitting element that emits ultraviolet light and three types of fluorescent materials that emit red (R), green (G), and blue (B) light, and systems using a light emitting element that emits blue light and a fluorescent material that emits, e.g., yellow light. Light emitting devices that employ systems using a light emitting element that emits blue light and a fluorescent material that emits, e.g., yellow light are demanded in a wide variety of fields, including lighting, such as fluorescent lamps, car lights, displays, and backlights for liquid crystals.

Conventional red-light emitting fluorescent materials that have an excitation band in the blue region and exhibit an emission peak with a narrow half bandwidth include fluoride fluorescent materials having a composition, such as $K_2AlF_5:Mn^{4+}$, $K_3AlF_6:Mn^{4+}$, $K_3GaF_6:Mn^{4+}$, $Zn_2AlF_7:Mn^{4+}$, $KIn_2F_7:Mn^{4+}$, $K_2SiF_6:Mn^{4+}$, $K_2TiF_6:Mn^{4+}$, $K_3ZrF_7:Mn^{4+}$, $Ba_{0.65}Zr_{0.35}F_{2.70}:Mn^{4+}$, $BaTiF_6:Mn^{4+}$, $K_2SnF_6:Mn^{4+}$, $Na_2TiF_6:Mn^{4+}$, $Na_2ZrF_6:Mn^{4+}$, or $KRbTiF_6:Mn^{4+}$. Various improvements to their production methods have been studied (see, e.g., Japanese Laid-open Patent Publication No. 2012-224536).

In connection with the above, a method for producing an $Mn^{4+}$-activated red light-emitting fluoride fluorescent material that has a small specific surface area and is said to have superior light emitting properties is disclosed (see, e.g., Japanese Laid-open Patent Publication No. 2010-209331).

SUMMARY OF THE INVENTION

A method for producing a fluoride fluorescent material includes preparing a first solution that contains manganese, a second solution that contains at least one cation selected from the group consisting of $K^+$, $Li^+$, $Na^+$, $Rb^+$, $Cs^+$, and $NH_4^+$, and a third solution that contains at least one element selected from the group consisting of elements from Groups 4 and 14 of the periodic table; and adding the first and third solutions dropwise, each at a rate of 0.3% or less of a prepared solution volume per minute, to the second solution to obtain particles having a composition represented by formula (I).

$$A_2[M_{1-a}Mn^{4+}{}_aF_6] \quad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of elements from Groups 4 and 14 of the periodic table; and a satisfies $0.04<a<0.20$.

The method can produce a fluoride fluorescent material that has excellent durability.

Figure 1:
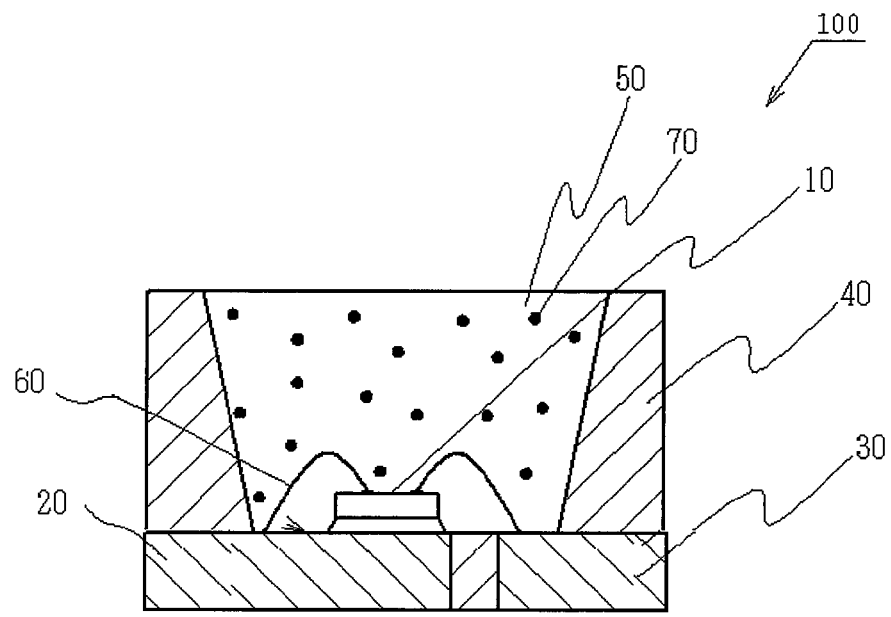
FIG. 1 is a schematic sectional view showing an example of a light emitting device according to the present embodiment.

DETAILED DESCRIPTION OF THE EMBODIMENT $Mn^{4+}$-activated red light-emitting fluoride fluorescent materials that have an emission peak with a narrow half-band width are desired to be widely put into practice. Conventional fluoride fluorescent materials, however, are not durable enough for use in harsh applications, such as use for lighting and need to be improved.

If a conventional $Mn^{4+}$-activated red light-emitting fluoride fluorescent material is used, for example, in a light-emitting device that has a low correlated color temperature (CCT) for lighting, the amount of the fluorescent material needs to be increased, which inevitably reduces light extraction efficiency. On the other hand, efforts are made to increase the compositional ratio of $Mn^{4+}$ to enhance the amount of emission, but such an increase in $Mn^{4+}$ compositional ratio may reduce the internal fluorescence quantum efficiency, failing to achieve sufficient light emitting properties.

In view of the above, an embodiment of this disclosure provides a red light-emitting fluorescent material having superior durability and a method for producing the same. This disclosure also provides a red light-emitting $Mn^{4+}$-activated fluoride fluorescent material that achieves both a high level of $Mn^{4+}$-activation and superior internal fluorescence quantum efficiency, a method for producing the same, and a light-emitting device including the fluoride fluorescent material and having high emission efficiency.

Specific means for solving these problems are as follows. The present invention encompasses the following modes.

The first mode is a method for producing a fluoride fluorescent material. The method includes preparing a first solution that contains manganese, a second solution that contains at least one cation selected from the group consisting of $K^+$, $Li^+$, $Na^+$, $Rb^+$, $Cs^+$, and $NH_4^+$, and a third solution that contains at least one element selected from the group consisting of the elements from Groups 4 and 14 of the periodic table, and adding the prepared first and third solutions dropwise, each at a rate of 0.3% or less of the total volume of the solution per minute to the second solution to obtain particles having a composition represented by formula (I).

$$A_2[M_{1-a}Mn^{4+}{}_aF_6] \qquad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies 0.01<a<0.20, and preferably satisfies 0.04<a<0.20.

The second mode is a method for producing a fluoride fluorescent material having an IR spectral area ratio, $Z^1$, which is given by formula (P), of less than $2.5 \times 10^{-3}$ in an infra-red absorption spectrum. Spectral area is the area defined by a spectral curve, a baseline, and a vertical line at each end of a selected range. The method includes heating particles having a composition represented by formula (I) at 100° C. or more in an atmosphere containing elemental fluorine.

$$A_2[M_{1-a}Mn^{4+}{}_aF_6] \qquad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies 0.01<a<0.20.

$$Z^1 = \text{(spectral area from 3500 cm}^{-1}\text{ to 3800 cm}^{-1}\text{)}/ \text{(spectral area from 1050 cm}^{-1}\text{ to 1350 cm}^{-1}\text{)} \qquad (P)$$

The third mode is a method for producing a fluoride fluorescent material. The method includes preparing a first solution that contains manganese, a second solution that contains at least one cation selected from the group consisting of $K^+$, $Li^+$, $Na^+$, $Rb^+$, $Cs^+$, and $NH_4^+$, and a third solution that contains at least one element selected from the group consisting of the elements from Groups 4 and 14 of the periodic table, adding the prepared first and third solutions dropwise, each at a rate of 0.3% or less of the total volume of the solution per minute to the second solution to obtain particles having a composition represented by formula (I), and heating a mixture that contains the resultant particles and a liquid medium containing elemental fluorine.

$$A_2[M_{1-a}Mn^{4+}{}_aF_6] \qquad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies 0.01<a<0.20.

The forth mode is a fluoride fluorescent material containing particles that have a composition represented by formula (I), and have an IR spectral area ratio, $Z^1$, which is given by formula (P), of less than $2.5 \times 10^{-3}$ in an infra-red absorption spectrum.

$$A_2[M_{1-a}Mn^{4+}{}_aF_6] \qquad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies 0.01<a<0.20.

$$Z^1 = \text{(spectral area from 3500 cm}^{-1}\text{ to 3800 cm}^{-1}\text{)}/ \text{(spectral area from 1050 cm}^{-1}\text{ to 1350 cm}^{-1}\text{)} \qquad (P)$$

The fifth mode is a fluoride fluorescent material having a composition represented by formula (I), and an internal fluorescence quantum efficiency of 80% or more.

$$A_2[M_{1-a}Mn^{4+}{}_aF_6] \qquad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies 0.04<a<0.10.

The sixth mode is a light emitting device. The light emitting device includes an excitation light source that emits light in the wavelength range of from 380 nm to 485 nm; a first fluorescent material selected from the group consisting of fluoride fluorescent materials obtained in the production methods described above and the fluoride fluorescent materials described above, and a second fluorescent material that absorbs light in the wavelength range of from 380 nm to 485 nm and has a maximum emission wavelength in the wavelength range of from 495 nm to 590 nm.

Hereinafter, the fluoride fluorescent materials, the method for producing the fluoride fluorescent materials, and the light emitting device according to the present disclosure will be described with reference to embodiments. The embodiments described below are mere examples of the fluoride fluorescent materials, the method for producing the fluoride fluorescent materials, and the light emitting devices for illustrating the technical concept of the present invention. The present invention is by no means limited to the fluoride fluorescent materials, the method for producing the fluoride fluorescent materials, and the light emitting devices described below. The members defined in the claims are by no means restricted to the members described in the embodiments. In particular, the size, material, and shape of each component member as well as the relative configuration of the component members, etc. that are described in the embodiments are mere examples, and the scope of the invention is not intended to be limited only to them unless otherwise specified. The sizes and positional relationship, or the like of the members in the drawings may be exaggerated to facilitate the understanding of the invention. In the descriptions below, components identified using the same names or reference numbers indicate the same members or members of the same quality, and their detailed explanation may be omitted if appropriate. Regarding the elements of the present invention, multiple elements may be made of the same member so that a single member functions as multiple elements, or, conversely, the function of a single element may be achieved by multiple members. The content described in some Examples and the embodiments may be applicable to the other Examples and embodiments.

The relationship between the color names and the chromaticity coordinates, the relationship between the wavelength ranges of light and the color names of monochromatic light, and others are in accordance with Japanese Industrial Standard (JIS) Z8110. In the present specification, the term "step" means not only an independent step but also a step which cannot be clearly distinguished from the other steps but can achieve the anticipated effect of this step. Further, for the amount of each component contained in a composition, when a plurality of compounds corresponding to the component exist, the amount of the component means the total amount of the compounds present in the composition unless otherwise specified.

<Method for Producing Fluoride Fluorescent Materials>

The first mode of the method for producing a fluoride fluorescent material of the present embodiment includes preparing a first solution that contains manganese, a second solution that contains at least one cation selected from the group consisting of $K^+$, $Li^+$, $Na^+$, $Rb^+$, $Cs^+$, and $NH_4^+$, and a third solution that contains at least one element selected from the group consisting of the elements from Groups 4 and 14 of the periodic table, and adding the prepared first and third solutions dropwise, each at a rate of 0.3% or less of the total volume of the solution per minute to the prepared second solution to obtain particles having a composition represented by formula (I).

$$A_2[M_{1-a}Mn^{4+}{}_aF_6] \quad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies $0.01<a<0.20$, and preferably satisfies $0.04<a<0.20$.

Adding the prepared first and third solutions dropwise, each at a rate of 0.3% or less of the total volume of the solution per minute to the second solution provides a fluoride fluorescent material that has superior internal fluorescence quantum efficiency with increased $Mn^{4+}$-activated amount. It is inferred that because, for example, the reaction for generating a fluoride fluorescent material progresses under adequate control, the distribution of the manganese in the fluoride fluorescent material particles becomes more uniform, which stabilizes the crystalline structure near $Mn^{4+}$ that activates fluoride fluorescent materials, or reduces crystal defects in the fluoride fluorescent materials. Further, the resultant fluorescent material is believed to have a high reflectance at the wavelength of 530 nm. Using such a fluorescent material in combination with a fluorescent material that emits green light, for example, for lighting, may reduce decreases in luminance in the green region.

It is also believed that the resultant fluorescent material particles contain less, for example, hydroxy groups and silanol residues on their surfaces, which results in improved durability. Reduction in the amounts of, for example, hydroxy groups and silanol residues on the surfaces of the fluorescent material particles, is confirmed by, for example, when the IR spectral area ratio, $Z'$, described later, is within a predetermined range.

The dropwise addition of the first and third solutions (hereinafter referred to as "the drop step") is performed by adding each at a rate of 0.3% or less of the initial liquid volume per minute. That is, the first and third solutions are added dropwise each over about 333.3 min (about 5.6 hours) or more. The rate of the dropwise addition of each solution per minute is preferably 0.1% or less of the initial liquid volume.

The drop rate of the first solution and the third solution may be appropriately selected each according to the prepared solution volume. The drop rate may be the same or different, and is preferably the same.

In the drop step, it is preferable that the first solution and the third solution are added dropwise while the second solution is stirred. The stirring method is not particularly limited, and may be suitably selected from the conventional stirring methods according to, for example, the production scale and the reaction vessel.

The temperature in the drop step is not particularly limited. It would suffice if, for example, the temperature of the second solution is controlled to be 40° C. or less, and the temperature is preferably controlled to be in the range of from 15° C. to 30° C.

The fluoride fluorescent material obtained by the method for producing a fluoride fluorescent material has a chemical composition represented by formula (I). In the formula (I), A is at least one cation selected from the group consisting of $K^+$, $Li^+$, $Na^+$, $Rb^+$, $Cs^+$, and $NH_4^+$, and A preferably contains $K^+$, and may further contain at least one cation selected from the group consisting of $Li^+$, $Na^+$, $Rb^+$, $Cs^+$, and $NH_4^+$ in addition to $K^+$ as the main component. Here, containing $K^+$ as the main component indicates that the content of $K^+$ in A of formula (I) is 80 mol % or more, preferably 90 mol % or more, and more preferably 95 mol % or more.

Further, a preferably satisfies $0.04<a<0.20$, more preferably satisfies $0.04<a<0.10$, and further preferably satisfies $0.04<a<0.08$.

In the fluoride fluorescent material obtained by the method for producing a fluoride fluorescent material, an internal fluorescence quantum efficiency may be 80% or more, and preferably 85% or more.

Further, in the resultant fluoride fluorescent material, the IR spectral area ratio, $Z^1$, which is described later, preferably has less than $2.5\times10^{-3}$, and more preferably $1.0\times10^{-3}$ or less. The IR spectral area ratio, $Z^1$, is preferably $1.0\times10^{-5}$ or more.

The first solution may contain at least a first complex ion containing a tetravalent manganese ion and hydrogen fluoride, and may further contain other components as necessary. The first solution may be obtained in the form of, for example, an aqueous hydrofluoric acid solution containing manganese source. The manganese source is not particularly limited as long as it is a compound that contains manganese. Specific examples of the manganese source that can constitute the first solution include $K_2MnF_6$, $KMnO_4$, and $K_2MnCl_6$. Of these, $K_2MnF_6$ is preferable, mainly because it can stably present in hydrofluoric acid in the form of $MnF_6$ complex ions while the activatable oxidation number (tetravalent) is maintained. Of the manganese sources, those containing, for example, an alkali metal, such as potassium, can also serve as a part of, for example, the alkali metal as the cation source to be contained in the second solution. The manganese sources that constitute the first solution may be used alone or in combination with each other.

The lower limit of the concentration of hydrogen fluoride in the first solution is usually 20 mass % or more, preferably 25 mass % or more, and more preferably 30 mass % or more. The upper limit of the concentration of hydrogen fluoride in the first solution is usually 80 mass % or less, preferably 75 mass % or less, and more preferably 70 mass % or less. When the concentration of hydrogen fluoride is 30 mass % or more, the manganese source (e.g., $K_2MnF_6$) constituting the first solution is more stable to hydrolysis, and the concentration of the tetravalent manganese in the first solution may vary less. This facilitates control of the amount of the manganese for activation in the fluoride fluorescent material to be obtained, and may lead to less variation in the light emission efficiency of the fluoride fluorescent material. When the hydrogen fluoride concentration is 70 mass % or less, decrease in the boiling point of the first solution is prevented or reduced, so that the generation of hydrogen fluoride gas is suppressed. This facilitates control of the hydrogen fluoride concentration in the first solution, and effectively reduces variation in particle diameter of the resultant fluoride fluorescent material particles.

The concentration of the manganese source in the first solution is not particularly limited. The lower limit of the concentration of the manganese source in the first solution is usually 0.01 mass % or more, preferably 0.03 mass % or more, and more preferably 0.05 mass % or more. The upper limit of the concentration of the manganese source in the first solution is usually 50 mass % or less, preferably 40 mass % or less, and more preferably 30 mass % or less.

The second solution preferably contains at least potassium. The second solution contains hydrogen fluoride and at least one cation selected from the group consisting of $K^+$, $Li^+$, $Na^+$, $Rb^+$, $Cs^+$, and $NH_4^+$, preferably $K^+$. The second solution may further contain other components as necessary. The second solution is obtained, for example, as an aqueous hydrofluoric acid solution that contains alkali metal ions, such as potassium ions. Specific examples of potassium sources containing potassium ions that can constitute the second solution include water soluble potassium salts, such as KF, $KHF_2$, KOH, KCl, KBr, KI, potassium acetate, and $K_2CO_3$. Of these, $KHF_2$ is preferable because it is soluble in the solution without reducing the concentration of hydrogen fluoride, and it has a low heat of dissolution and is highly safe. Besides potassium sources, examples of the sources of cations, such as alkali metal, include $NaHF_2$, $Rb_2CO_3$, and $Cs_2CO_3$. The sources of cations, such as alkali metal, constituting the second solution may be used alone or in combination with each other.

The lower limit of the concentration of hydrogen fluoride in the second solution is usually 20 mass % or more, preferably 25 mass % or more, and more preferably 30 mass % or more. The upper limit of the concentration of hydrogen fluoride in the second solution is usually 80 mass % or less, preferably 75 mass % or less, and more preferably 70 mass % or less.

The lower limit of the concentration of the source of cations in the second solution is usually 5 mass % or more, preferably 10 mass % or more, and more preferably 15 mass % or more. The upper limit of the concentration of the cation source is usually 80 mass % or less, preferably 70 mass % or less, and more preferably 60 mass % or less.

The third solution may preferably contains at least the second complex ions containing fluorine ions and an element selected from the group consisting of the elements from Groups 4 and 14 of the periodic table, and may contain additional components as necessary. The third solution can be obtained, for example, as an aqueous solution containing the second complex ions.

The second complex ions preferably contain at least one selected from the group consisting of titanium (Ti), zirconium (Zr), hafnium (Hf), silicon (Si), germanium (Ge) and tin (Sn), more preferably contain silicon (Si), or silicon (Si) and germanium (Ge), and, still more preferably, the second complex ions are silicon fluoride complex ions.

If, for example, the second complex ions contain silicon (Si), the source of the second complex ions is preferably a compound that contains silicon and fluorine atom and that is highly soluble in the solution. Specific examples of such sources of the second complex ions include $H_2SiF_6$, $Na_2SiF_6$, $(NH_4)_2SiF_6$, $Rb_2SiF_6$, and $Cs_2SiF_6$. Of these, $H_2SiF_6$ is preferable because it is highly soluble in water and contains no alkali metal element as an impurity. The sources of the second complex ions constituting the third solution may be used alone or in combination with each other.

The lower limit of the concentration of the source of the second complex ions in the third solution is usually 5 mass % or more, preferably 10 mass % or more, and more preferably 15 mass % or more. The upper limit of the concentration of the source of the second complex ions in the third solution is usually 80 mass % or less, preferably 70 mass % or less, and more preferably 60 mass % or less.

The first solution and third solution are added dropwise to the second solution at a predetermined rate per unit time, while mixing. This allows the first complex ions, cations such as alkali metal ions, and the second complex ions to react in predetermined proportions to precipitate as crystals or a fluoride fluorescent material having the desired chemical composition represented by formula (I). The precipitated fluoride fluorescent material can be collected through solid-liquid separation, filtration or the like. The fluoride fluorescent material may be washed with a solvent, such as ethanol, isopropyl alcohol, water, and acetone. The fluoride fluorescent material may be then dried usually at 50° C. or more, preferably at 55° C. or more, and more preferably at 60° C. or more, and usually at 150° C. or less, preferably at 120° C. or less, and more preferably at 110° C. or less. The drying time is not particularly limited as long as all the water in the precipitate is vaporized, and it may be about 10 hours, for example.

When the first solution, the second solution and the third solution are mixed, it is preferable to suitably adjust the mixing ratio so as to obtain a product or a fluoride fluorescent material having the intended chemical composition, considering the difference between the initial composition of the first solution, the second solution and the third solution and the chemical composition of the resultant fluoride fluorescent material.

The second mode of the method for producing a fluoride fluorescent material includes heating the particles having a composition represented by formula (I) (hereinafter also referred to as "fluoride particles") at 100° C. or more under an atmosphere containing elemental fluorine. The fluoride particles may be produced by a conventional method, and is preferably produced by the above-described first mode of the production method.

It is believed that heating the fluoride particles at 100° C. or more under an atmosphere containing elemental fluorine reduces the content of, for example, hydroxy groups and silanol residues on the surface of the fluoride particles, resulting in improved durability of the particles.

The atmosphere containing elemental fluorine may be a liquid or a gas, and is preferably a liquid. When the atmosphere containing elemental fluorine is a liquid, it may be, for example, a liquid medium containing a fluorine compound, such as hydrogen fluoride. When the atmosphere containing elemental fluorine is a gas, for example, it may be a gas containing a fluorine compound, such as hydrogen fluoride, or a fluorine gas.

When the atmosphere containing elemental fluorine is a liquid, examples of the liquid medium include organic solvents including: water, alcohol solvents, such as methanol, ethanol, and isopropyl alcohol; ketone solvents, such as acetone and methyl ethyl ketone; and ether solvents, such as diethyl ether and diisopropylether. Examples of the fluorine compound include hydrogen fluoride (HF), hexafluorosilicate ($H_2SiF_6$), and inorganic acid salts, such as hydrogen fluoride potassium ($KHF_2$) and potassium fluoride (KF). These fluorine compounds to be contained in the liquid medium may be used alone or in combination with each other.

The atmosphere containing elemental fluorine may further contain other components in addition to the fluorine compound. Examples of the components other than the fluorine compound include inorganic acids, such as nitric acid ($HNO_3$); peroxides, such as hydrogen peroxide; and inorganic acid salts containing a potassium ion, such as nitric acid potassium ($KNO_3$). Of them, components other than the fluorine compound preferably contain at least a potassium ion, and more preferably contain at least an inorganic acid salt containing a potassium ion. The components other than the fluorine compound may be used alone or in combination with each other.

The concentration of the fluorine compound in a liquid medium is not particularly limited, and may be appropriately selected according to the purpose, for example. If, for example, the liquid medium contains hydrogen fluoride, the concentration of the hydrogen fluoride may be 30 mass % to 60 mass %, and preferably 45 mass % to 60 mass %. If the liquid medium contains a fluoride salt, such as hydrogen fluoride potassium, the concentration may be from 10 mass % to 25 mass %, and preferably from 15 mass % to 20 mass %.

When the atmosphere containing elemental fluorine is a gas, it may contain a gaseous medium other than a fluorine gas or a fluorine compound. Examples of the gaseous medium include nitrogen ($N_2$), argon (Ar), and oxygen ($O_2$). Of these, an inert atmosphere, such as nitrogen, is preferable to suppress oxidization of the fluoride fluorescent material. The components of the gaseous medium may be used alone or in combination with each other.

When the atmosphere containing elemental fluorine is a gas, the concentration of the fluorine gas or the fluorine compound may be, for example, 10 vol % or more, and is preferably 15 vol % or more.

The temperature of the heating treatment is 100° C. or more, preferably 110° C. or more, more preferably 120° C. or more, and still more preferably 150° C. or more. The upper limit of the temperature is not particularly limited, and is preferably 600° C. or less, and more preferably, 550° C. or less in view of the durability and production efficiency.

Further, the heating treatment is preferably performed in a liquid medium to improve durability and dispersion.

The heating treatment may be performed under a pressurized condition. If pressure is applied, the pressure conditions are not particularly limited and may be appropriately selected according to the purpose, for example. When the heating treatment is performed using a liquid, the heating may be performed under a sealed atmosphere to avoid vaporization of the liquid. According to calculations, the pressure to be applied is preferably 1.5 MPa or more, and more preferably, 2.5 MPa or more to improve durability. The upper limit of the pressure is not particularly limited, and is preferably 30 MPa or less, and more preferably, 15 MPa or less in view of durability and production efficiency. When the heating treatment is performed using a gaseous medium, the pressure is preferably from atmospheric pressure to 1 MPa or less.

The duration for the heating treatment may be appropriately selected according to the conditions, such as the amount of treatment and temperature. The treating duration is preferably 1 hour or more, and more preferably 2 hour or more to improve durability, for example. The upper limit of the treating duration is not particularly limited, and is preferably 48 hours or less, and more preferably, 24 hours or less in view of durability and production efficiency.

The method for producing the fluoride fluorescent material may further includes after-treatments, such as isolation treatment, refining treatment, and drying treatment of the fluoride fluorescent material, in addition to the heating treatment of the fluoride particles performed under an atmosphere containing elemental fluorine.

<Fluoride Fluorescent Material>

One mode of the fluoride fluorescent material according to the present embodiment has a composition represented by formula (I), and has an IR spectral area ratio, $Z^1$, which is obtained by formula (P), of less than $2.5 \times 10^{-3}$ in an infra-red absorption spectrum.

$$A_2[M_{1-a}Mn^{4+}{}_aF_6] \qquad (I)$$

In formula (I), A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies $0.01 < a < 0.20$.

$$Z^1 = \text{(spectral area from 3500 cm}^{-1}\text{ to 3800 cm}^{-1}\text{)} / \text{(spectral area from 1050 cm}^{-1}\text{ to 1350 cm}^1\text{)} \qquad (P)$$

Figure 4:
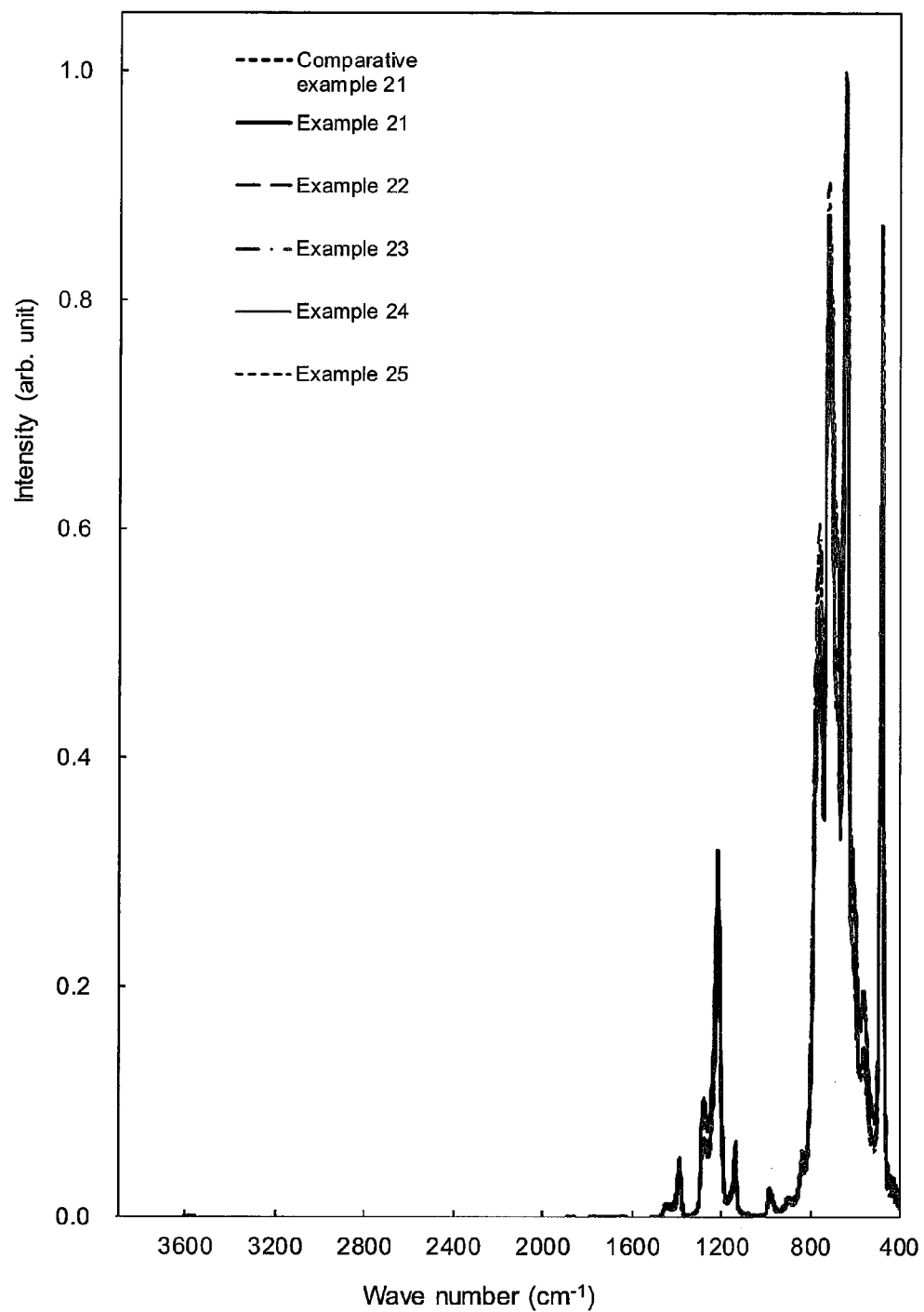
FIG. 4 shows an example of the infra-red absorption spectra of fluoride fluorescent materials according to the present embodiment and that of a conventional fluoride fluorescent material for comparison.
Figure 5:
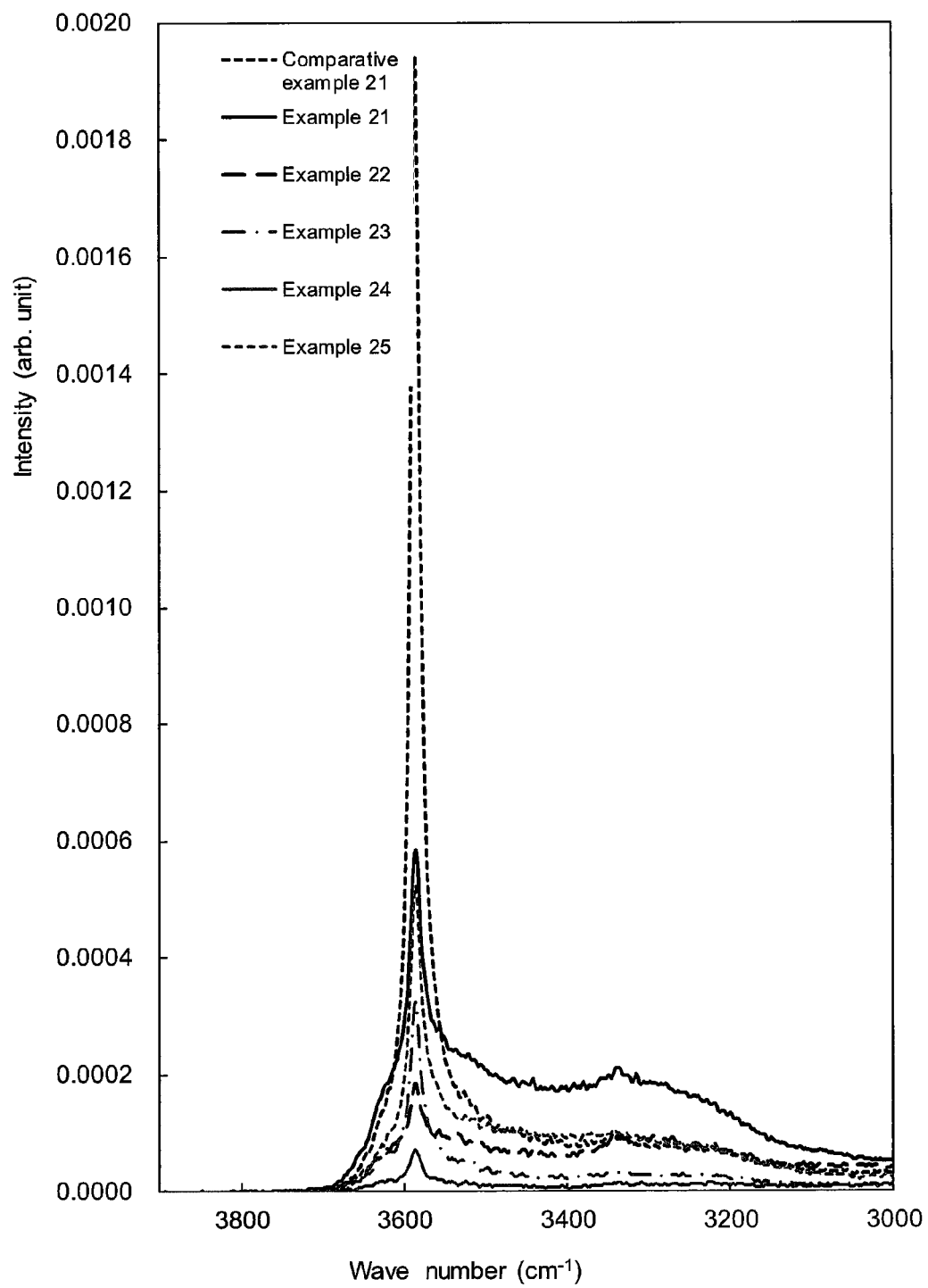
FIG. 5 is an enlarged graph of a portion of the infra-red absorption spectra of fluoride fluorescent materials according to the present embodiment and that of a conventional fluoride fluorescent material shown in FIG. 4.

FIG. 4 is a graph showing a comparison of examples of the infra-red absorption spectra of fluoride fluorescent materials according to the present embodiment with those of comparative examples. FIG. 5 is an enlarged graph of the portion ranging in the wavenumber from 3000 cm$^{-1}$ to 3900 cm$^{-1}$ of the infra-red absorption spectra shown in FIG. 4. Although the details will be described later, the IR spectral area ratio, $Z^1$, which is an area ratio of the spectral area from the wavenumber range of from 3500 cm$^{-1}$ to 3800 cm$^{-1}$ to the spectral area from the wavenumber range of from 1050 cm$^{-1}$ to 1350 cm$^{-1}$ in the infra-red absorption spectrum of the fluoride fluorescent material, is smaller than $2.5 \times 10^{-3}$. This results in a fluoride fluorescent material with superior durability. A light-emitting device including this fluoride fluorescent material also exhibits superior long-term reliability. Here, it is believed that the absorption in the range of from 1050 cm$^{-1}$ to 1350 cm$^{-1}$ is an absorption arising from the fluoride fluorescent material itself, the absorption in the range of from 3000 cm$^{-1}$ to 3800 cm$^{-1}$ is an absorption arising from, for example, water ($H_2O$), and the absorption in the range of from 3500 cm$^{-1}$ to 3800 cm$^{-1}$ is an absorption arising from, for example, silanol residue (Si—OH). That is, the IR spectral area ratio, $Z^1$, being $2.5 \times 10^{-3}$ or less indicates that the amount of the component attributable to OH contained in the fluoride fluorescent material is less. Such a fluoride fluorescent material is believed to have fewer crystal defects or the like, in particular, on its surface, resulting in improved durability.

In the fluoride fluorescent material, the IR spectral area ratio, $Z^1$, is preferably $1.0 \times 10^{-3}$ or less in view of durability.

The lower limit of the IR spectral area ratio, $Z^1$, is not particularly limited, and may be suitably selected according to, for example, the purpose. The IR spectral area ratio, $Z^1$, is, for example, larger than 0, and is preferably $1.0 \times 10^{-5}$ or more. When $Z^1$ is larger than 0, for example, the surface of the fluoride fluorescent material particles are hydrophilic. The hydrophilicity is likely to increase dispersion of the fluoride fluorescent material particles in a resin or increase the fluidity of the uncured resin composition containing the fluoride fluorescent material. This facilitates workability in the production of a light emitting device.

The infra-red absorption spectrum of the fluoride fluorescent material is measured by diffuse reflection using potassium bromide (KBr) as a background. The area of the peak in the wavenumber range of from 3500 cm$^{-1}$ to 3800 cm$^{-1}$ is calculated using a straight line connecting the absorption intensity at 3000 cm$^{-1}$ to the absorption intensity at 3800 cm$^{-1}$ as a background. The spectral area in the wavenumber range of from 1050 cm$^{-1}$ to 1350 cm$^{-1}$ is calculated using a straight line connecting the absorption intensities at either end of the integration range as a background. The actual calculation of areas may be made by, for example, using software supplied with an infra-red spectrometer.

The fluoride fluorescent material having an IR spectral area ratio, $Z^1$, in a specific range may be produced, for example, by the second mode of the production method. The fluoride particles, having, for example, a composition represented by formula (I) may be produced through the heating treatment at 100° C. or more under an atmosphere containing elemental fluorine. Fluoride particles having a composition represented by formula (I) are preferably produced by the above-described first mode of the production method.

The fluoride fluorescent material contains particles having a composition represented by formula (I). In the formula (I), A is at least one cation selected from the group consisting of lithium ion ($Li^+$), sodium ion ($Na^+$), potassium ion ($K^+$), rubidium ion ($Rb^+$), cesium ion ($Cs^+$), and ammonium ion ($NH_4^+$). Of these, A is at least one cation selected from the group consisting of $Li^+$, $Na^+$, $K^+$, $Rb^+$, $Cs^+$, and $NH_4^+$, and preferably contains $K^+$, and more preferably further contains another cation of, for example, alkali metal, in addition to $K^+$ as the main component. Here, "$K^+$ as the main component" indicates that the content of $K^+$ in A in formula (I) is 80 mol % or more, preferably 90 mol % or more, and more preferably 95 mol % or more.

In formula (I), M is at least one element selected from the group consisting of the elements from Groups 4 and 14 of the periodic table. M is preferably at least one element selected from the group consisting of titanium (Ti), zirconium (Zr), hafnium (Hf), silicon (Si), germanium (Ge), and tin (Sn), more preferably contains silicon (Si), or silicon (Si) and germanium (Ge), and still more preferably is silicon (Si), or silicon (Si) and germanium (Ge) in view of light emitting properties.

When M includes silicon (Si), or silicon (Si) and germanium (Ge), a part of at least one of the Si and Ge may be substituted by at least one element selected from the group consisting of elements from Group 4 of the periodic table including Ti, Zr, and Hf and elements from Group 14 of the periodic table including C and Sn. In that case, the total content percentage of Si and Ge in M is not particularly limited. For example, it is preferably 90 mol % or more and more preferably 95 mol % or more.

In formula (I), it is preferable for A to contain $K^+$, and for M to contain Si.

a in formula (I) is from 0.01 to 0.20, and is preferably from 0.015 to 0.15, more preferably from 0.02 to 0.10, still more preferably from 0.03 to 0.10, and even more preferably from 0.04 to 0.10, and even further preferably from 0.04 to 0.08 in view of light emitting efficiency and light emitting intensity.

Another mode of the fluoride fluorescent material according to the present embodiment is a fluoride fluorescent material having a composition represented by formula (I) and an internal fluorescence quantum efficiency of 80% or more. In the formula, A denotes at least one cation selected from the group consisting of $K^+$, $Li^+$, $Na^+$, $Rb^+$, $Cs^+$, and $NH_4^+$; M denotes at least one element selected from the group consisting of the elements from Groups 4 and 14 of the periodic table; and a satisfies 0.04<a<0.10.

$$A_2[M_{1-a}Mn^{4+}{}_aF_6] \quad (I)$$

The fluoride fluorescent material of the present embodiment has superior light emitting efficiency because it has a sufficient $Mn^{4+}$-activated amount and has an internal fluorescence quantum efficiency of 80% or more. When the fluoride fluorescent material is incorporated, in particular, in a light-emitting device having a correlated color temperature (CCT) of less than 4000 K, superior light extraction efficiency will be achieved with less amount of the fluoride fluorescent material.

The internal fluorescence quantum efficiency of the fluoride fluorescent material is 80% or more, and is preferably 85% or more. The internal fluorescence quantum efficiency of the fluoride fluorescent material may be measured, for example, by the method later described.

The fluoride fluorescent material having an internal fluorescence quantum efficiency within a predetermined range may be produced, for example, by the first mode of the production method.

In formula (I), which represents the chemical composition of the fluoride fluorescent material, a satisfies 0.04<a<0.10, and it is preferable that a should satisfy 0.04<a<0.08.

a in formula (I) is the $Mn^{4+}$-activated amount in the fluoride fluorescent material, and the $Mn^{4+}$-activated amount in the fluoride fluorescent material (hereinafter also referred to as "analyzed Mn concentration") is measured, for example, by the method described later.

In formula (I), A is at least one cation selected from the group consisting of lithium ion ($Li^+$), sodium ion ($Na^+$), potassium ion ($K^+$), rubidium ion ($Rb^+$), cesium ion ($Cs^+$), and ammonium ion ($NH_4^+$). Of these, A is at least one cation selected from the group consisting of $Li^+$, $Na^+$, $K^+$, $Rb^+$, $Cs^+$, and $NH_4^+$, preferably contains $K^+$, and more preferably further contains at least one cation selected from the group consisting of $Li^+$, $Na^+$, $Rb^+$, $Cs^+$, and $NH_4^+$ in addition to $K^+$ as the main component. Here, "$K^+$ as the main component" indicates that the content of $K^+$ in A in formula (I) is 80 mol % or more, preferably 90 mol % or more, and more preferably 95 mol % or more.

In formula (I), M is at least one element selected from the group consisting of the elements from Groups 4 and 14 of the periodic table. In view of light emitting properties, M is preferably at least one element selected from the group consisting of titanium (Ti), zirconium (Zr), hafnium (Hf), silicon (Si), germanium (Ge) and tin (Sn), more preferably contains silicon (Si), or silicon (Si) and germanium (Ge), and still more preferably is silicon (Si), or silicon (Si) and germanium (Ge).

When M includes silicon (Si), or silicon (Si) and germanium (Ge), a part of at least one of the Si and Ge may be substituted by at least one element selected from the group consisting of elements from Group 4 of the periodic table including Ti, Zr, and Hf, and elements from Group 14 of the periodic table including C and Sn.

In formula (I), it is preferable for A to contain $K^+$, and for M to contain Si.

Although the particle size and particle size distribution of the fluoride particles according to the present embodiment are not particularly limited, a single-peak particle size distribution is preferable, and a single-peak particle size distribution with a narrow distribution width is more preferable in view of emission intensity and durability. The particle size of the fluoride particles is, for example, 1 μm to 100 μm, preferably 5 μm to 70 μm, and more preferably 20 μm to 70 μm in terms of volume average particle size. The specific surface area and the bulk density of the fluoride fluorescent material are not particularly limited. The volume average particle size of the fluoride particle is a particle size (median size) measured using a laser diffraction particle size analyzer (MASTER SIZER 2000 by MALVERN).

The fluoride fluorescent material is an $Mn^{4+}$-activated fluorescent material, capable of emitting red light by absorbing visible light in the short wavelength region. The excitation light as short wavelength-visible light is preferably light mainly in the blue region. Specifically, the excitation light preferably has an intensity spectrum with a main peak wavelength in the range of from 380 nm to 500 nm, more preferably in the range of from 380 nm to 485 nm, still more preferably in the range of from 400 nm to 485 nm, and even more preferably in the range of from 440 nm to 480 nm.

The emission wavelength of the fluoride is not particularly limited as long as it has a longer wavelength than that of the excitation light and the light emitted is red. The emission spectrum of the fluoride preferably has a peak wavelength in the range of from 610 nm to 650 nm. The half bandwidth of the emission spectrum is preferably narrow, and specifically, it is preferably 10 nm or less.

<Light Emitting Device>

The light emitting device of the present embodiment includes an excitation light source that emits light in the wavelength range of from 380 nm to 485 nm, a first fluorescent material that contains the above-described fluoride fluorescent material, and a second fluorescent material that absorbs light in the wavelength range of from 380 nm to 485 nm and has a maximum emission wavelength in the wavelength range of from 495 nm to 590 nm.

Incorporating, as a first fluorescent material, a fluoride fluorescent material having a chemical composition represented by formula (I) and an internal fluorescence quantum efficiency of 80% or more improves the light emitting device having superior light emitting efficiency. Thus, the size of the light-emitting device package may be reduced, and the less of the first fluorescent material is needed to satisfy desired properties, such as correlated color temperature.

The light emitting device of the present embodiment may have a correlated color temperature (CCT) of, for example, less than 4000 K, or 3800 K or less, or in the range of from 2200 K to 3600 K. The correlated color temperature may be measured in accordance with JIS Z 8725:1999.

A light emitting device including a fluoride fluorescent material, as the first fluorescent material, having a chemical composition represented by formula (I) and an IR spectral area ratio, $Z^1$, of less than $2.5 \times 10^{-3}$ achieves superior durability and superior long-term reliability. That is, the decrease in the output and chromaticity change in a light emitting device that includes the fluoride fluorescent material over time is suppressed, so that the device can advantageously be used under harsh applications, such as lighting.

(Excitation Light Source)

As the excitation light source that excites the first fluorescent material and the second fluorescent material, a light source that emits light in the wavelength range of from 380 nm to 485 nm, which is in the short wavelength region of visible light, is used. The excitation light source preferably has an emission peak wavelength in the wavelength range of from 420 nm to 485 nm, and more preferably in the wavelength range of from 440 nm to 480 nm. This enables efficient excitation of the first fluorescent material and the second fluorescent material, and effective use of visible light. By using an excitation light source in this wavelength range, a light emitting device having high emission intensity can be provided.

A semiconductor light emitting element (hereinafter also referred to simply as "light emitting element") is preferably used as the excitation light source. For example, as blue and green light emitting elements, an excitation light source of a nitride semiconductor ($In_X Al_Y Ga_{1-X-Y} N$, $0 \leq X$, $0 \leq Y$, $X+Y \leq 1$) may be used.

Using a semiconductor light emitting element as the excitation light source provides a highly efficient light emitting device that has high output linearity to the input and is resistant and stable to mechanical impact.

(First Fluorescent Material)

The first fluorescent material includes a fluoride fluorescent material selected from the group consisting of fluoride fluorescent materials having a chemical composition represented by formula (I) and an internal fluorescence quantum efficiency of 80% or more; fluoride fluorescent materials having an IR spectral area ratio, $Z^1$, of less than $2.5 \times 10^{-3}$; and fluoride fluorescent materials produced by the above-described production method. The details of the fluoride fluorescent material and the production method are the same as already described, and the preferable modes are also the same. These alternatives may be used alone or in combination with each other as the first fluorescent material.

(Second Fluorescent Material)

The second fluorescent material absorbs light in the wavelength range of from 380 nm to 485 nm and has a maximum emission wavelength in the wavelength range of from 495 nm to 590 nm. A light emitting device including the second fluorescent material is used more advantageously as lighting.

The second fluorescent material is preferably at least one selected from, for example, the group consisting of nitride fluorescent materials, oxynitride fluorescent materials, and sialon fluorescent materials, which are mainly activated by a lanthanoid element, such as Eu and Ce; alkaline-earth halogenapatite fluorescent materials, alkaline-earth metal borate halogen fluorescent materials, alkaline-earth metal aluminate fluorescent materials, alkaline-earth silicates, alkaline-earth sulfides, alkaline-earth thiogallates, alkaline-earth silicon nitrides, and germanate salts that are mainly activated by a lanthanoid element, such as Eu or a transition metal element, such as Mn; rare-earth aluminate and rare-earth silicate, which are mainly activated by a lanthanoid element, such as Ce; and at least one selected from an organic compound and an organic complex, which are mainly activated by a lanthanoid element, such as Eu.

The second fluorescent material is preferably at least one selected from the group consisting of β sialon fluorescent materials having a composition represented by formula (IIa); halo-silicate fluorescent materials having a composition represented by formula (IIb); silicate fluorescent materials having a composition represented by formula (IIc); rare-earth aluminate fluorescent materials having a composition represented by formula (IId); and sulfide fluorescent materials having a composition represented by formula (IIe).

$$Si_{6-t}Al_tO_tN_{8-t}:Eu \quad \text{(IIa)}$$

wherein t satisfies $0 < t \leq 4.2$ $$(Ca,Sr,Ba)_8 MgSi_4 O_{16}(F,Cl,Br)_2:Eu \quad \text{(IIb)}$$

$$(Ba,Sr,Ca,Mg)_2 SiO_4:Eu \quad \text{(IIc)}$$

$$(Y,Lu,Gd,Tb)_3(Al,Ga)_5 O_{12}:Ce \quad \text{(IId)}$$

$$(Ba,Sr,Ca)Ga_2 S_4:Eu \quad \text{(IIe)}$$

These second fluorescent materials may either be used alone or in combination with each other.

The light emitting device may further include other fluorescent materials in addition to the first fluorescent material and the second fluorescent material. Other fluorescent materials may be preferably at least one selected from the group consisting of, for example, $Sr_4 Al_{14} O_{25}:Eu$, $(Ba,Sr,Ca)Si_2 O_2 N_2:Eu$, $(La,Y)_3 Si_6 N_{11}:Ce$, $Ca_3 Sc_2 Si_3 O_{12}:Ce$, $CaSc_2 O_4:Ce$, $Ba_3 Si_6 O_{12}N_2:Eu$, $(Sr,Ca)AlSiN_3:Eu$, (Ca,Sr, Ba,)$_2$Si$_5$N$_8$:Eu, and 3.5MgO.0.5MgF$_2$.GeO$_2$:Mn. These other fluorescent materials may be used either alone or in combination with each other.

The first fluorescent material and the second fluorescent material (hereinafter collectively referred to simply as "the fluorescent materials") preferably constitute a fluorescent member together with a binding agent for covering a light emitting element. Examples of the binding agent that constitutes a fluorescent member include thermosetting resins, such as epoxy resin, silicone resin, epoxy-modified silicone resin, and modified silicone resin.

The total content of the fluorescent materials in the fluorescent member is not particularly limited, and may be appropriately selected according to the purpose, for example. The total content of the fluorescent materials may be, for example, from 20 parts by mass to 300 parts by mass, preferably from 25 parts by mass to 200 parts by mass, more preferably from 30 parts by mass to 160 parts by mass, and still more preferably from 35 parts by mass to 130 parts by mass, relative to 100 parts by mass of the binding agent. With the content of the fluorescent materials within this range in the fluorescent member, the light emitting element can be fully covered, the wavelength of the light emitted from the light emitting element can be efficiently converted by the fluorescent materials, and the light emitting device can emit light more efficiently.

The mass ratio of the second fluorescent material to the first fluorescent material (the second fluorescent material:the first fluorescent material) in the light emitting device is, for example, from 5:95 to 95:5, preferably from 10:90 to 90:10, more preferably from 15:85 to 85:15, and still more preferably from 20:80 to 80:20. A light emitting device including the first fluorescent material and the second fluorescent material within these ranges will have higher color rendering and superior emission intensity.

The fluorescent member may further contain, for example, a filler and a diffusing agent in addition to the binding agent and the fluorescent materials. Examples of the filler include silica, titanium oxide, zinc oxide, zirconium oxide, and alumina.

When the fluorescent member contains a filler, the content may be appropriately selected according to the purpose, for example. The content of the filler may be, for example, 1 part by mass to 20 parts by mass relative to 100 parts by mass of the binding agent.

The form of the light emitting device is not particularly limited and may be appropriately selected from the conventional forms. Examples of the forms of the light emitting device include through-hole mounting and surface mounting types. In through-hole mounting, a light-emitting device is fixed to a mount board by placing leads of the light-emitting device into through-holes formed in the mount board. In contrast, with surface mounting, the leads of the light-emitting device are fixed to the surface of the mount board.

A light emitting device 100 according to an embodiment of this disclosure will be explained with reference to the drawings. FIG. 1 is a schematic cross-sectional view of a light emitting device 100. The light emitting device 100 is an example of a surface-mounted light emitting device.

The light emitting device 100 includes a light emitting element 10, which is composed of a gallium nitride compound semiconductor that emits visible light in the short wavelength range (e.g., 380 nm to 485 nm) and has an emission peak wavelength in the range of from 430 nm to 470 nm, and a molded body 40 on which the light emitting element 10 is disposed. The molded body 40 includes a first lead 20, a second lead 30, and a thermoplastic resin or a thermosetting resin, which are formed in an integral manner. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescence member 50. The fluorescence member 50 preferably contains a thermosetting resin, such as epoxy resin, silicone resin, epoxy-modified silicone resin, and modified silicone resin. The fluorescence member 50, for example, is composed of such resin and a fluoride fluorescent material 70 that converts the wavelength of light emitted from the light emitting element 10. The fluorescent material 70 contains a first fluorescent material and a second fluorescent material.

The fluorescence member 50 is formed by filling, for example, a translucent resin or glass into the recess of the molded body 40 in such a manner to cover the light emitting element 10 disposed in the recess. To facilitate production, the resin that constitutes the fluorescence member is preferably a translucent resin. Although a silicone resin composition may be preferably used as a translucent resin, an insulating resin composition, such as an epoxy resin composition and an acrylic resin composition, may also be used. Although the fluorescence member 50 contains a fluorescent material 70, it may contain other materials as necessary. For example, a light diffusing agent may ease the directivity of light emitted from the light emitting element, widening the angle of visibility.

The fluorescence member 50 serves not only as a member containing a fluorescent material 70 for converting the wavelength, but also as a member for protecting the light emitting element 10 and the fluorescent material 70 from the outside environment. In FIG. 1, the particles of the fluorescent material 70 are approximately evenly dispersed in the entire fluorescence member 50. This results in light with less color unevenness.

Figure 2:
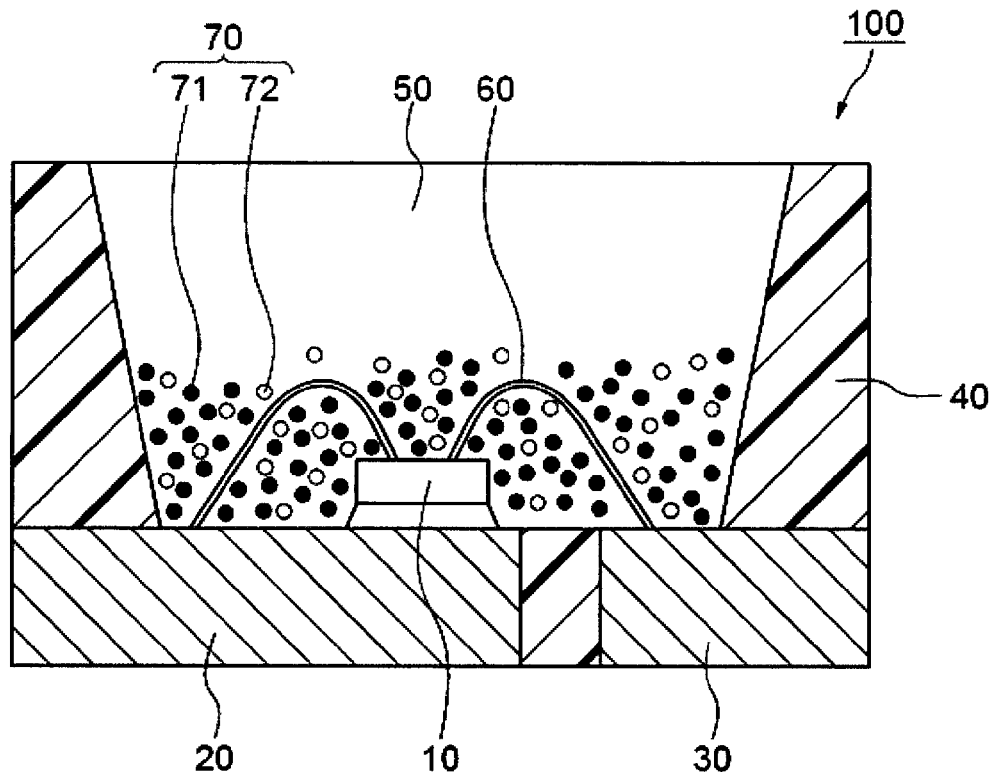
FIG. 2 is a schematic sectional view showing another example of a light emitting device according to the present embodiment.

FIG. 2 is a schematic cross-sectional view of another example of a light emitting device according to the present embodiment. FIG. 2 shows the fluorescent material 70 containing a mixture of the particles of the first fluorescent material 71 and particles of the second fluorescent material 72. The particles of the fluorescent material 70 are unevenly dispersed in the fluorescence member 50. Arranging the particles of the fluorescent material 70 closer to the light emitting element 10 as shown in FIG. 2 allows efficient conversion of the wavelength of light from the light emitting element 10, thereby providing a light emitting device with superior light emitting efficiency. It should be noted that the arrangement of the particles of the fluorescent material 70 and the light emitting element 10 in the fluorescence member 50 is not limited to such close-to-each-other arrangement, and the particles of the fluorescent material 70 may be arranged spaced apart from the light emitting element 10 within the fluorescence member 50 to avoid the influence of heat on the fluorescent material 70.

Figure 3:
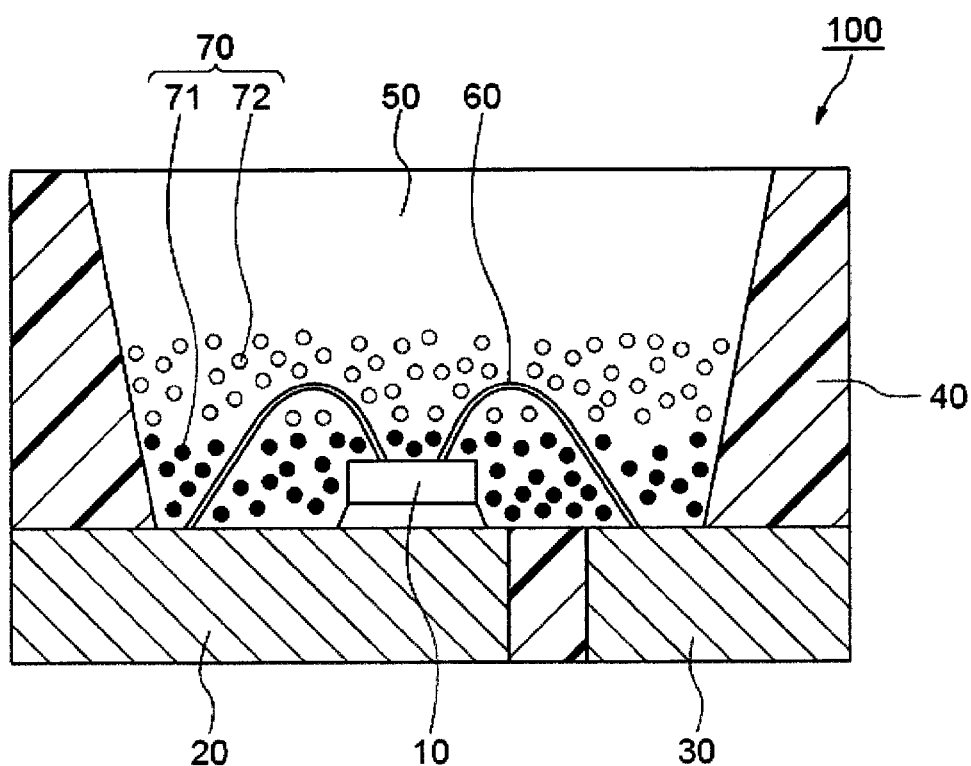
FIG. 3 is a schematic sectional view showing still another example of a light emitting device according to the present embodiment.

FIG. 3 is a schematic cross-sectional view showing a yet another example of a light emitting device according to the present embodiment. In FIG. 3, the first fluorescent material 71 and the second fluorescent material 72 are arranged such that the first fluorescent material 71 is closer to the light emitting element 10 than the second fluorescent material 72. This facilitates efficient excitation of the first fluorescent material 71 by light from the light emitting element 10. This may also help minimizes excitation of the first fluorescent material 71 due to the emission of light of the second fluorescent material 72.

EXAMPLES

The present invention will be specifically described below by means of Examples, but the present invention is not limited to these Examples.

Preparation of Fluoride Fluorescent Materials

Example 1

239.9 g of $K_2MnF_6$ was weighed and dissolved in 3.3 L of an aqueous solution of 55 mass % HF to prepare a first solution. Then, 2343 g of $KHF_2$ was weighed and dissolved in 9.9 L of an aqueous solution of 55 mass % HF to prepare a second solution. Subsequently, 4.28 L of an aqueous solution containing 40 mass % $H_2SiF_6$ was prepared as a third solution.

The first solution and the third solution were each added dropwise to the second solution while being stirred at room temperature over about 20 hours. The resultant precipitate was collected through solid-liquid separation, then washed with ethanol, and dried at 90° C. for 10 hours to prepare the fluoride fluorescent material of Example 1.

Examples 2 to 5

The fluoride fluorescent materials of Examples 2 to 5 were prepared in the same manner as the fluoride fluorescent material of Example 1 except that the initial compositional ratios were changed as shown in Table 1.

Comparative Example 1

322.7 g of $K_2MnF_6$ was weighed and dissolved in 3.3 L of an aqueous solution of 55 mass % HF to prepare a first solution. Then, 2343 g of $KHF_2$ was weighed and dissolved in 8.5 L of an aqueous solution of 55 mass % HF to prepare a second solution. Subsequently, 4.28 L of an aqueous solution containing 40 mass % of $H_2SiF_6$ was prepared as a third solution.

The first solution and the third solution were each added dropwise to the second solution while being stirred at room temperature over about 50 min. The resultant precipitate was collected through solid-liquid separation, then washed with ethanol, and dried at 90° C. for 10 hours to prepare the fluoride fluorescent material of Comparative Example 1.

Comparative Example 2

174.5 g of $K_2MnF_6$ was weighed and dissolved in 3.3 L of an aqueous solution of 55 mass % HF to prepare a first solution. Then, 2343 g of $KHF_2$ was weighed and dissolved in 8.5 L of an aqueous solution of 55 mass % HF to prepare a second solution. Subsequently, 4.28 L of an aqueous solution containing 40 mass % of $H_2SiF_6$ was prepared as a third solution.

The first solution and the third solution were each added dropwise to the second solution while being stirred at room temperature over about 20 hours. The resultant precipitate was collected through solid-liquid separation, then washed with ethanol, and dried at 90° C. for 10 hours to prepare the fluoride fluorescent material of Comparative Example 2.

<Evaluation>

(Internal Fluorescence Quantum Efficiency)

To avoid complications in measuring the internal fluorescence quantum efficiency of each of the resultant fluoride fluorescent materials due to re-excitation, the internal fluorescence quantum efficiency of the resultant fluoride fluorescent materials was measured at excitation of 455 nm using a Quantum Efficiency Measurement System that eliminates re-excitation (model number: QE-2100) by Otsuka Electronics Co., Ltd. The results are shown in Table 1.

(Analysis of Mn Concentration)

For each of the resultant fluoride fluorescent materials, composition analysis using inductively-coupled plasma (ICP) technique was carried out and the Mn concentration (mol %) was calculated. The results are shown in Table 1.

TABLE 1

| | Initial Compositional ratio (mol) | | | Analyzed Mn concentration | Internal quantum |
|---|---|---|---|---|---|
| | K | Si | Mn | (mol %) | efficiency (%) |
| Example 1 | 1.8 | 0.950 | 0.055 | 4.2 | 87.7 |
| Example 2 | 1.8 | 0.950 | 0.061 | 4.8 | 89.8 |
| Example 3 | 1.8 | 0.950 | 0.074 | 5.9 | 88.0 |
| Example 4 | 1.8 | 0.950 | 0.086 | 6.5 | 87.1 |
| Example 5 | 1.8 | 0.950 | 0.098 | 8.0 | 83.1 |
| Comparative example 1 | 1.8 | 0.950 | 0.074 | 5.8 | 76.0 |
| Comparative example 2 | 1.8 | 0.950 | 0.040 | 3.0 | 90.4 |

Preparation of Light Emitting Devices

Example 6

As the first fluorescent material, the fluoride fluorescent material of Example 1 was used. As the second fluorescent material, $Y_3(Al,Ga)_5O_{12}$:Ce was used. The binding agent was a resin, and a phenyl silicone resin was used. A package having side walls that define a recess was prepared, and a light emitting element was disposed in the recess. A composition prepared by mixing the fluorescent materials and the resin was then injected into the recess of the package using a syringe. A light emitting element that emits light having an emission peak wavelength in the range of from 380 nm to 485 nm was used as the light emitting element.

The light emitting device of Example 6 was fabricated by adjusting the mass ratio of the second fluorescent material to the first fluorescent material as well as the mass ratio of the amount of the fluorescent material to the amount of the resin so that the correlated color temperature (CCT) was 3500 [K]. The mass ratio shown in Table 2 indicates that the mass ratio of the second fluorescent material to the first fluorescent material (the second fluorescent material:the first fluorescent material) was 23:77. The content of the fluorescent material in the composition was 125 parts by mass relative to 100 parts by mass of the binding agent.

Examples 7 to 10

The light emitting devices of Examples 7 to 10 were fabricated in the same manner as the light emitting device of Example 6 by adjusting the mass ratio of the second fluorescent material to the first fluorescent material as well as the mass ratio of the amount of the fluorescent material to the amount of the resin so that the correlated color temperature (CCT) was 3500 [K], except that the fluoride fluorescent materials of Examples 2 to 5 were used, respectively, as the first fluorescent materials as shown in Table 2. The resultant respective mass ratios are as shown in Table 2.

Examples 11 and 12

The light emitting devices of Examples 11 and 12 were fabricated in the same manner as the light emitting device of Example 6, except that the fluoride fluorescent materials of Examples 2 and 3 were used, respectively, as the first fluorescent materials as shown in Table 2; that a β sialon (β-SiAlON) represented by the compositional formula (Si,Al)$_6$(O,N)$_8$:Eu was used instead of Y$_3$(Al,Ga)$_5$O$_{12}$:Ce as the second fluorescent material; and that the mass ratio of the second fluorescent material to the first fluorescent material as well as the mass ratio of the amount of the fluorescent material to the amount of the resin were adjusted so that the color tone of the respective light emitting devices was represented by the chromaticity coordinates: x/y=0.280/0.280.

The respective mass ratios of the second fluorescent materials to the first fluorescent materials were as shown in Table 2.

Comparative Example 3

The light emitting device of Comparative Example 3 was fabricated in the same manner as that of Example 6 by adjusting the mass ratio of the second fluorescent material to the first fluorescent material as well as the mass ratio of the amount of the fluorescent material to the amount of the resin so that the correlated color temperature (CCT) was 3500 [K], except that the fluoride fluorescent material of Comparative Example 2 was used as the first fluorescent material.

The final mass ratio as the mass ratio of the second fluorescent material to the first fluorescent material (the second fluorescent material:the first fluorescent material) was 18:82 as shown in Table 2, and the content of the fluorescent material in the composition was 140 parts by mass relative to 100 parts by mass of the binding agent.

Comparative Example 4

The light emitting device of Comparative Example 4 was fabricated in the same manner as that of Example 6, except that the fluoride fluorescent material of Comparative Example 2 was used as the first fluorescent material; that a β sialon (β-SiAlON) represented by the compositional formula (Si,Al)$_6$(O,N)$_8$:Eu was used instead of Y$_3$(Al,Ga)$_5$O$_{12}$:Ce as the second fluorescent material; and that the mass ratio of the second fluorescent material to the first fluorescent material as well as the mass ratio of the amount of the fluorescent material to the amount of the resin were adjusted so that the color tone of the light emitting device was represented by the chromaticity coordinates: x/y=0.280/0.280.

The final mass ratio as the mass ratio of the second fluorescent material to the first fluorescent material (the second fluorescent material:the first fluorescent material) was 28:72 as shown in Table 2, and the content of the fluorescent material in the composition was 50 parts by mass relative to 100 parts by mass of the binding agent.

TABLE 2

| | Fluorescent materials | | Analyzed Mn concentration of First fluorescent material (mol %) | Total content of Fluorescent materials relative to 100 parts by mass of Binding agent (parts by mass) | Mass ratio of fluorescent materials | |
|---|---|---|---|---|---|---|
| | Second fluorescent material | First fluorescent material | | | Second fluorescent material | First fluorescent material |
| Example 6 | Y$_3$(Al,Ga)$_5$O$_{12}$:Ce | Example 1 | 4.2 | 125 | 23.0 | 77.0 |
| Example 7 | Y$_3$(Al,Ga)$_5$O$_{12}$:Ce | Example 2 | 4.8 | 125 | 24.5 | 75.5 |
| Example 8 | Y$_3$(Al,Ga)$_5$O$_{12}$:Ce | Example 3 | 5.9 | 110 | 28.0 | 72.0 |
| Example 9 | Y$_3$(Al,Ga)$_5$O$_{12}$:Ce | Example 4 | 6.5 | 100 | 30.0 | 70.0 |
| Example 10 | Y$_3$(Al,Ga)$_5$O$_{12}$:Ce | Example 5 | 8.0 | 95 | 33.0 | 67.0 |
| Comparative example 3 | Y$_3$(Al,Ga)$_5$O$_{12}$:Ce | Comparative example 2 | 3.0 | 140 | 18.0 | 82.0 |
| Example 11 | β-SiAlON | Example 2 | 4.8 | 40 | 35.0 | 65.0 |
| Example 12 | β-SiAlON | Example 3 | 5.9 | 37 | 38.0 | 62.0 |
| Comparative example 4 | β-SiAlON | Comparative example 2 | 3.0 | 50 | 28.0 | 72.0 |

As shown in Table 2, the light emitting devices of Examples 6 to 10 were all confirmed to have a lower amount of fluorescent materials than that of the light emitting device of Comparative Example 3 because fluoride fluorescent materials having a higher amount of Mn were used. Likewise, as shown in Table 2, the light emitting devices of Examples 11 and 12 were both confirmed to have a lower amount of fluorescent materials than those of the light emitting device of Comparative Example 4 because fluoride fluorescent materials having a higher amount of Mn were used.

<Evaluation>

For each of the resultant respective light emitting devices, luminous flux was measured using an integrating sphere. The luminous fluxes of Examples 6 to 10 are all relative to that of Comparative Example 3, which is taken as 100.0%. The luminous fluxes of Examples 11 and 12 are all relative to that of Comparative Example 4, which is taken as 100.0%. The results are shown in Table 3.

TABLE 3

| | Fluorescent materials | | Analyzed Mn concentration of First fluorescent material (mol %) | Chromaticity coordinates | | Relative luminous flux (%) |
| --- | --- | --- | --- | --- | --- | --- |
| | Second fluorescent material | First fluorescent material | | x | y | |
| Example 6 | $Y_3(Al,Ga)_5O_{12}$:Ce | Example 1 | 4.2 | 0.408 | 0.392 | 103.2 |
| Example 7 | $Y_3(Al,Ga)_5O_{12}$:Ce | Example 2 | 4.8 | 0.411 | 0.392 | 103.3 |
| Example 8 | $Y_3(Al,Ga)_5O_{12}$:Ce | Example 3 | 5.9 | 0.415 | 0.393 | 103.2 |
| Example 9 | $Y_3(Al,Ga)_5O_{12}$:Ce | Example 4 | 6.5 | 0.403 | 0.385 | 107.4 |
| Example 10 | $Y_3(Al,Ga)_5O_{12}$:Ce | Example 5 | 8.0 | 0.413 | 0.392 | 108.8 |
| Comparative example 3 | $Y_3(Al,Ga)_5O_{12}$:Ce | Comparative example 2 | 3.0 | 0.409 | 0.392 | 100.0 |
| Example 11 | β-SiAlON | Example 2 | 4.8 | 0.287 | 0.283 | 102.7 |
| Example 12 | β-SiAlON | Example 3 | 5.9 | 0.290 | 0.285 | 103.0 |
| Comparative example 4 | β-SiAlON | Comparative example 2 | 3.0 | 0.280 | 0.280 | 100.0 |

As shown in Table 3, the light emitting devices of Examples 6 to 10 all exhibit improved relative luminous fluxes as compared to that of the light emitting device of Comparative Example 3 because fluoride fluorescent materials having a higher amount of Mn were used. Likewise, the light emitting devices of Examples 11 and 12 both exhibit improved relative luminous fluxes as compared to that of the light emitting device of Comparative Example 4 because fluoride fluorescent materials having a higher amount of Mn were used.

Preparation of Fluoride Fluorescent Materials

Comparative Example 21

209.9 g of $K_2MnF_6$ was weighed and dissolved in 3.3 L of an aqueous solution of 55 mass % HF to prepare a first solution. In addition, 2343 g of $KHF_2$ was weighed and dissolved in 9.9 L of an aqueous solution of 55 mass % HF to prepare a second solution. Subsequently, 4.28 L of an aqueous solution containing 40 mass % of $H_2SiF_6$ was prepared as a third solution.

The first solution and the third solution were each added dropwise to the second solution while being stirred at room temperature over about 50 min. The resultant precipitate was collected through solid-liquid separation, then washed with ethanol, and dried at 90° C. for 10 hours to prepare the fluoride fluorescent material of Comparative Example 21.

Example 21

239.9 g of $K_2MnF_6$ was weighed and dissolved in 3.3 L of an aqueous solution of 55 mass % HF to prepare a first solution. Then, 2343 g of $KHF_2$ was weighed and dissolved in 9.9 L of an aqueous solution of 55 mass % HF to prepare a second solution. Subsequently, 4.28 L of an aqueous solution containing 40 mass % of $H_2SiF_6$ was prepared as a third solution.

The first solution and the third solution were each added dropwise to the second solution while being stirred at room temperature over about 20 hours. The resultant precipitate was collected through solid-liquid separation, then washed with ethanol, and dried at 90° C. for 10 hours to prepare the fluoride fluorescent material of Example 21.

Example 22

7.0 g of $KHF_2$ was dissolved in 33 g of an aqueous solution of 55 mass % HF to prepare a liquid medium 1 (Liquid medium 1). Liquid medium 1 and 50 g of the fluoride fluorescent material obtained in Example 21 were placed into a fluorine resin-coated autoclave and subjected to heat-and-pressure treatment at 170° C. under about 2.3 MPa for 12 hours. After solid-liquid separation, the resultant product was washed with ethanol and dried at 90° C. for 10 hours to prepare the fluoride fluorescent material of Example 22.

Example 23

The fluoride fluorescent material of Example 23 was prepared in the same manner as that of Example 21, except that the amount of the HF aqueous solution of the second solution was changed to 10.5 L.

Example 24

The fluoride fluorescent material obtained in Example 23 was subjected to heat-and-pressure treatment under the same conditions as those of Example 22 to prepare the fluoride fluorescent material of Example 24.

Example 25

The fluoride fluorescent material of Example 25 was prepared in the same manner as that of Example 21, except that the amount of $K_2MnF_6$ of the first solution was changed to 359.9 g.

<Evaluation>

(Light-Emitting Luminance Properties)

For each of the resultant fluoride fluorescent materials, the light-emitting luminance properties were measured in a usual manner. The light-emitting luminance properties were measured at an excitation wavelength of 460 nm. The measurement was carried out at 25° C. using a fluorescence spectrophotometer, F-4500 (by Hitachi High-Technologies Corporation). The results are shown in the Table below each as a relative luminance to the comparative example when the luminance of the comparative example 21 is taken as 100%. The chromaticity coordinates of each fluorescence are also shown in the Table.

(Amount of Mn)

The resultant fluoride fluorescent materials were subjected to composition analysis using ICP technique, and the amount of Mn was calculated as analyzed Mn concentration (compositional ratio with K as a standard, corresponding to a in formula (I)). The results are shown in Table 4.

(IR Spectroscopy: FT-IR Evaluation)

The infra-red absorption spectra of the resultant fluoride fluorescent materials were measured by diffuse reflection using a Fourier transform infra-red spectrometer, iS50 (by Thermo Fisher Scientific K.K.) with a KBr background. The measured values were adjusted using the value at 4000 cm$^{-1}$ as a baseline, subjected to Kubelka-Munk conversion, and normalized to the maximum peak to obtain the absorption spectra.

FIG. 4 shows the infra-red absorption spectra of the fluoride fluorescent materials of the Examples and the infra-red absorption spectra of the fluoride fluorescent materials of the Comparative Examples. FIG. 5 is an enlarged graph of the portion ranging in the wavenumber from 3000 cm$^{-1}$ to 3900 cm$^{-1}$ of the infra-red absorption spectra shown in FIG. 4. The peak components in the wavenumber ranges of 1050 cm$^{-1}$ to 1350 cm$^{-1}$ and 3500 cm$^{-1}$ to 3800 cm$^{-1}$ were selected and each of the IR spectral areas including the selected peak components was obtained by integration. In addition, the IR spectral area ratios, $Z^1$s, were calculated as an area ratio expressed by formula (P). The spectral area in the range of from 3500 cm$^{-1}$ to 3800 cm$^{-1}$ was obtained using a straight line connecting the intensity at 3000 cm$^{-1}$ to the intensity at 3800 cm$^{-1}$ as a background, and the spectral area in the range of from 1050 cm$^{-1}$ to 1350 cm$^{-1}$ was obtained using a straight line connecting the intensity at 1050 cm$^{-1}$ to the intensity at 1350 cm$^{-1}$ as a background. Here, it is believed that the absorption in the range of from 1050 cm$^{-1}$ to 1350 cm$^{-1}$ arises from the fluoride fluorescent material itself, the absorption in the range of from 3000 cm$^{-1}$ to 3800 cm$^{-1}$ arises from, for example, $H_2O$, and the absorption in the range of from 3500 cm$^{-1}$ to 3800 cm$^{-1}$ arises from, for example, Si—OH.

$Z^1$=(spectral area from 3500 cm$^{-1}$ to 3800 cm$^{-1}$)/ (spectral area from 1050 cm$^{-1}$ to 1350 cm$^{-1}$)   (P)

<Preparation of Light Emitting Devices>

The fluoride fluorescent material of Example 21 was used as the first fluorescent material. A β sialon represented by $(Si,Al)_6(O,N)_8$:Eu and having an emission peak wavelength of around 540 nm was used as the second fluorescent material. The binding agent was a resin, and a silicone resin was used. Adjustments were made so that the color tone of the light emitting device was represented by the chromaticity coordinates: x/y=0.280/0.280. A package having side walls that define a recess was prepared, and a light emitting element was disposed in the recess. A composition prepared by mixing the fluorescent materials and the resin was then injected into the recess of the package using a syringe. The silicone resin was cured to produce a light emitting device. A semiconductor light emitting element that emits light having an emission peak wavelength of 451 nm was used as the light emitting element.

The light emitting devices were fabricated in the same manner as described above, except that the fluoride fluorescent materials of Examples 22 to 25 and Comparative Example 21 were used as the first fluorescent materials.

(Durability of Light Emitting Devices: LED Durability)

For each of the light emitting devices made using the resultant fluoride fluorescent materials of Examples 21 to 25 and Comparative Example 21, the value of x was measured in chromaticity coordinates after about 150 hours of continuous light emission with a current of 150 mA in an environment of 85° C. The amount of change in value x from the initial value for each light emitting device was denoted by Δx. The amount of shift, Δx, in Comparative Example 1 was taken as a reference. The Δx in each Example divided by the Δx in Comparative Example 1 was taken as the percentage change in Δx and evaluation was made by comparing percentage changes in color shift in relative terms. The results are shown in Table 4. When the percentage of change in the Δx of Comparative Example 1 is used as a standard of 100, a value smaller than this indicates a smaller shift in color after a lapse of the same length of time, which in turn indicates superior durability.

TABLE 4

|  | IR spectral area | | IR spectral area ratio | Amount of Mn | Particle size | Fluorescent material chromaticity coordinates | | Relative luminance | LED durability: percentage change in Δx |
|  | 1050-1350 (cm$^{-1}$) | 3500-3800 (cm$^{-1}$) | $Z^1$ | (a) | (μm) | x | y | (%) |  |
| --- | --- | --- | --- | --- | --- | --- | --- | --- | --- |
| Comparative example 21 | 17.0 | 0.057 | 3.3 × 10$^{-3}$ | 0.035 | 27.0 | 0.679 | 0.312 | 100.0 | 100.0 |
| Example 21 | 11.4 | 0.004 | 0.3 × 10$^{-3}$ | 0.044 | 22.7 | 0.679 | 0.312 | 98.6 | 69.3 |
| Example 22 | 15.8 | 0.012 | 0.8 × 10$^{-3}$ | 0.037 | 26.6 | 0.679 | 0.312 | 106.1 | 38.8 |
| Example 23 | 13.3 | 0.013 | 1.0 × 10$^{-3}$ | 0.042 | 25.3 | 0.678 | 0.312 | 103.6 | 69.7 |
| Example 24 | 17.3 | 0.003 | 0.2 × 10$^{-3}$ | 0.034 | 28.5 | 0.678 | 0.312 | 110.3 | 38.7 |
| Example 25 | 12.2 | 0.024 | 2.0 × 10$^{-3}$ | 0.062 | 23.9 | 0.679 | 0.312 | 111.1 | 87.2 |

As shown in Table 4, the amounts of Mn in the fluorescent materials of Comparative Example 21 and Examples 21 to 25 are 0.034 to 0.062, as expressed as a range of a in formula (I), and the chromaticity coordinates of the fluorescent materials are all approximately the same. The IR spectral area ratios, $Z^1$s, as determined by IR spectroscopy, of Examples 21 to 24 fall in a range of from 0.2×10$^{-3}$ to 2.0×10$^{-3}$ and are smaller than 3.3×10$^{-3}$ of Comparative Example 21. The relative luminances of Examples 22 and 24, which were subjected to a heat treatment, are even greater than those of Examples 21 and 23, which were not subjected to a heat treatment. Moreover, Examples 22 and 24 show further improvement in LED durability. The major difference between Examples 21 and 23 and Examples 22 and 24 lies in the average particle size, demonstrating that a larger average particle size translates to a greater relative luminance of a fluoride fluorescent material, while maintaining a high LED durability.

Example 25, which has the highest amount of Mn in the Examples, also has a smaller IR spectral area ratio, $Z^1$, than the Comparative Example. That is, even Example 25, which is relatively likely to have defects in the fluoride fluorescent material because of the higher amount of Mn, shows improvement in LED durability.

Thus a reduction in specific IR spectral area in a fluoride fluorescent material, particularly those arising from Si—OH, is believed to result in a reduction in the amount of OH, $H_2O$, and the like attached to the fluoride, leading to a reduction in defects in the fluoride fluorescent material, thereby improving LED durability.

The light emitting device of the present embodiment can be used, for example, as light sources for lighting, various indicators, automobiles, displays, backlights for liquid crystals, sensors, traffic lights, automobile components, advertising channel letters, and various other light sources.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a fluoride fluorescent material, comprising:
    preparing a first volume of a first solution that contains manganese, a second volume of a second solution that contains at least one cation selected from the group consisting of $K^+$, $Li^+$, $Na^+$, $Rb^+$, $Cs^+$, and $NH_4^+$, and a third volume of a third solution that contains a complex ion containing at least one element selected from the group consisting of elements from Groups 4 and 14 of the periodic table, wherein
    a concentration of a source of manganese in the first solution ranges from 0.01 mass % to 50 mass %,
    a concentration of a source of the at least one cation in the second solution ranges from 5 mass % to 80 mass %, and
    a concentration of a source of the complex ion in the third solution ranges from 5 mass % to 80 mass %; and
    adding dropwise, to the second solution, the first solution at a rate of 0.3% or less of a total volume of the first solution to be added per minute, and the third solution at a rate of 0.3% or less of a total volume of the third solution to be added per minute, to obtain particles having a composition represented by formula (I):

$$A_2[M_{1-a}Mn^{4+}{}_aF_6] \tag{I}$$

wherein
    A denotes at least one cation selected from the group consisting of $K^+$, $Li^+$, $Na^+$, $Rb^+$, $Cs^+$, and $NH_4^+$;
    M denotes at least one element selected from the group consisting of elements from Groups 4 and 14 of the periodic table; and
    α satisfies 0.04<α<0.20.

2. The method according to claim 1, wherein the rate of the dropwise addition for the first solution is 0.1% or less of the total volume of the first solution to be added per minute and the rate of the dropwise addition for the third solution is 0.1% or less of the total volume of the third solution to be added per minute.

3. The method according to claim 1, wherein a satisfies 0.04<a<0.10.

4. The method according to claim 1, further comprising heating the resultant particles at 100° C. or more in an atmosphere containing elemental fluorine.

5. The method according to claim 1, further comprising heating a mixture comprising the resultant particles and a liquid medium that contains elemental fluorine.

* * * * *